United States Patent [19]
Leidich

[11] 3,938,054
[45] Feb. 10, 1976

[54] TRANSISTOR AMPLIFIER
[75] Inventor: Arthur John Leidich, Flemington, N.J.
[73] Assignee: RCA Corporation, New York, N.Y.
[22] Filed: Jan. 16, 1975
[21] Appl. No.: 541,518

[52] U.S. Cl. ............... 330/30 D; 330/38 M; 330/40
[51] Int. Cl.² ....................... H03F 3/04; H03F 3/45
[58] Field of Search..... 330/22, 25, 28, 30 D, 38 M, 330/40, 69

[56] References Cited
UNITED STATES PATENTS
3,717,821  2/1973  Amemiya et al.............. 330/30 D X

*Primary Examiner*—James B. Mullins
*Attorney, Agent, or Firm*—H. Christoffersen; S. Cohen; A. L. Limberg

[57] ABSTRACT

First and second transistors have their emitter electrodes connected to receive operating current from the same supply. A current amplifier has its input circuit connected to sense the base current of the second transistor and its output circuit connected to supply base current to the first transistor responsive to the sensed current. This current amplifier connection stabilizes the quiescent collector currents of the first and second transistors to predictable values. Balanced output currents responsive to an input signal coupled to the first transistor base electrode are available from the collector electrodes of the first and second transistors.

4 Claims, 3 Drawing Figures

TRANSISTOR AMPLIFIER

The present invention relates to a transistor amplifier having an input transistor of bipolar type and, more particularly, to a network for applying bias current to that input transistor.

The application of a direct bias current from the collector electrode of a transistor of a first conductivity type to the base electrode of another transistor of a second, complementary type used as the input stage of a transistor amplifier is known. It is also known that it is desirable to develop a direct bias current inversely proportional to the $h_{fe}$ or common-emitter forward current gain of the transistor in the input stage, so that the quiescent collector current of the transistor can be controlled in a predictable manner to facilitate direct coupling of the input stage to subsequent amplifier stages. Certain of these circuits have sensed the collector current in the input stage transistor by means of another transistor operated in cascode relationship therewith, the base current of this other transistor being applied to the input terminal of a current amplifier having minus-unity gain and having its output terminal connected to supply bias current to the base electrode of the input stage transistor. This cannot always be done, particularly where there is little available collector supply potential for the input stage transistor.

The present invention is embodied in a transistor amplifier wherein the first input stage transistor has its emitter electrode connected together with that of a second transistor to receive a predetermined total current flow from a common supply. The first and second transistors have similar current gains. A direct-coupled amplifier with a predictable, negative transfer characteristic is connected with input terminal at the base electrode of the second transistor and with output terminal at the base electrode of the first transistor. The combined value of the collector currents of the first and second transistors is predictably determined from the total current flow to their emitter electrodes, and the ratio of the collector currents is predictably determined by the transfer characteristic of the direct-coupled amplifier. In the drawing:

Figure 1:
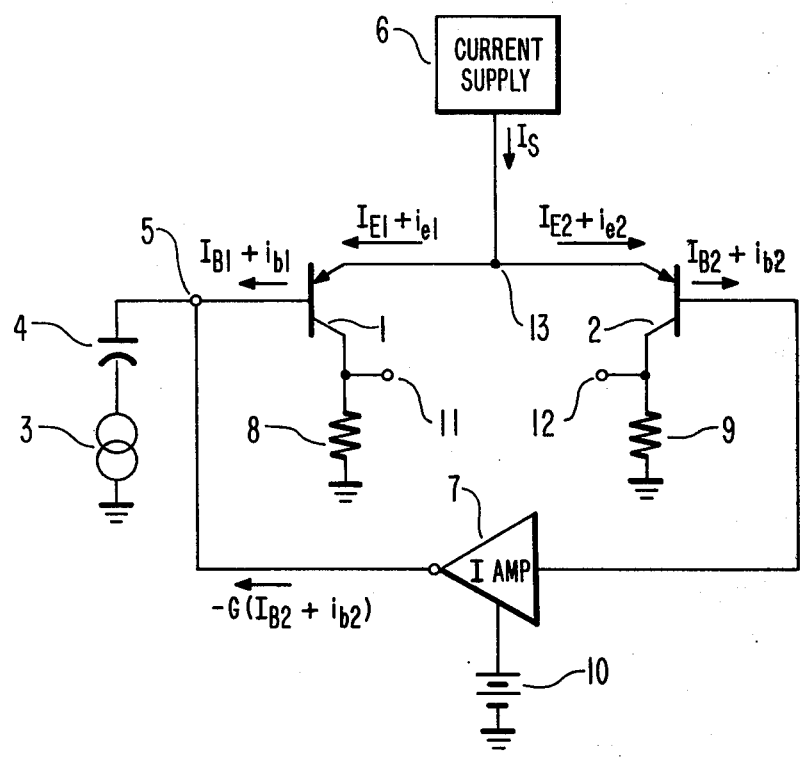
FIG. 1 is a schematic diagram partially in block form, of one embodiment of the present invention.

In FIG. 1, transistors 1 and 2 are transistors of the same conductivity type, operating at substantially the same temperature and having the same common-emitter forward current gains or $h_{fe}$'s--as may exist in a monolithic integrated circuit, for example. A source 3 supplies an input signal $i_{IN}$ via capacitor 4 to an input terminal 5, to which terminal the base electrode of input stage transistor 1 is connected. A current supply 6 supplies a current $I_S$ at an interconnection 13 between the emitter electrodes of transistors 1 and 2. A current amplifier 7 has its input terminal connected to the base electrode of transistor 2 and its output terminal connected at terminal 5 to the base electrode of transistor 1.

Current amplifier 7 has a low impedance input circuit between its input terminal and its common terminal which common terminal is connected to receive biasing potential provided in FIG. 1 by battery 10. This biasing potential is coupled through the input circuit of current amplifier 7 to reverse bias the collector-base junction of transistor 2. Current supply 6 forward-biases the base-emitter junctions of both transistors 1 and 2, and the collector-base junction of transistor 1 is accordingly reverse-biased. In this way, transistors 1 and 2 are arranged for operation in the normal mode of transistor operation. The open-loop output impedance of amplifier 7 viewed from its output terminal is theoretically infinite and in practice usually is high compared to the open-loop input impedance at the base electrode of transistor 1.

The base current of transistor 1 is the sum of direct and signal components $I_{B1}$ and $i_{b1}$, respectively; its emitter current is the sum of direct and signal components $I_{E1}$ and $i_{e1}$, respectively; and its collector current is the sum of direct and signal components $I_{C1}$ and $i_{c1}$, respectively. The base current of transistor 2 is the sum of direct and signal components $I_{B2}$ and $i_{b2}$, respectively; its emitter current is the sum of direct and signal components $I_{E2}$ and $i_{e2}$, respectively; and its collector current is the sum of direct and signal components $I_{C2}$ and $i_{c2}$, respectively. The negative transfer characteristic of current amplifier 7 is its current gain of $-G$. Current gain of this nature, where the output current has the opposite sense of swing from the input current, is commonly referred to as "inverting current gain". Responding to the base current $(I_{B2} + i_{b2})$ of transistor 2 flowing in its input circuit, current amplifier 7 delivers from its output circuit a current $-G(I_{B2} + i_{b2})$ applied to terminal 5.

Kirchoff's Current Law requires the following condition to be met at terminal 5.

$$i_{IN} + (I_{B1} + i_{b1}) - G(I_{B2} + i_{b2}) = 0 \tag{1}$$

This equation, by reason of the Superposition Principle, reduces to the following two equations.

$$i_{IN} + i_{b1} - Gi_{b2} = 0. \tag{2}$$
$$IB_1 = GI_{B2} \tag{3}$$

Dealing first with the latter equation; since transistors 1 and 2 are presumed to have the same current gains, their quiescent collector currents will be related in the same ratio as their quiescent base currents. That is, $$I_{C1} = GI_{C2} \tag{4}$$

Kirchoff's Current Law requires the following condition be met at the interconnection between the emitter electrodes of transistors 1 and 2 to which $I_S$ is applied.

$$I_S = (I_{E1} + i_{e1}) + (I_{E2} + i_{e2}) \tag{5}$$

This equation, by reason of the Superposition Principle, reduces to the following two equations.

$$i_{e1} = -i_{e2} \tag{6}$$
$$I_S = I_{E1} + I_{E2} \tag{7}$$

The latter equation may have the folowing identities, each obvious to one skilled in the art, substituted into it.

$$I_{C1} = \left( \frac{h_{fe}}{h_{fe} + 1} \right) I_{E1} \tag{8}$$

$$I_{C2} = \left( \frac{h_{fe}}{h_{fe} + 1} \right) I_{E2} \tag{9}$$

The quantity $h_{fe}/(h_{fe}+1)$ is the common-base amplifier gain or "alpha" factor, which for good transistors, approaches unity. With such substitution, equation 10 is obtained.

$$I_{c1} + I_{c2} = \left(\frac{h_{fe}}{h_{fe}+1}\right) I_s \overset{\circ}{=} I_s \qquad (10)$$

(An equals sign with circle thereover signifies approximate equality, the degree of approximation in all instances of use in this specification being equal to the closeness with which the alpha factor of transistors 1 and 2 approximates unity). Cross-solving equations 4 and 10, first for $I_{c1}$ and then for $I_{c2}$, one obtains equations 11 and 12, following.

$$I_{c1} = \left(\frac{G}{G+1}\right)\left(\frac{h_{fe}}{h_{fe}+1}\right) I_s \overset{\circ}{=} \frac{GI_s}{(G+1)} \qquad (11)$$

$$I_{c2} = \left(\frac{1}{G+1}\right)\left(\frac{h_{fe}}{h_{fe}+1}\right) I_s \overset{\circ}{=} \frac{I_s}{(G+1)} \qquad (12)$$

So, $I_{c1}$ and $I_{c2}$ are well-defined in terms of $I_s$ where G is well-defined and $h_{fe}$ is reasonably large.

This certainty of the quiescent collector current of transistors 1 and 2 permits the potential drops appearing across collector resistors 8 and 9 to be accurately predicated and facilitates direct coupling of output terminals 11 or 12 to subsequent circuitry. Of course, one may use only one or the other of these collector resistors and its associated output terminal. The output signal potential appearing at terminal 12 will be of the same sense of swing as the input signal potential applied to terminal 5; and the output signal at terminal 11 of the opposite sense of swing. The potential gains of the amplifier will be the same as that of other emitter-coupled transistor pairs. Also, other types of collector loads may be used instead of resistors 8 and 9.

The presence of amplifier 7 reduces the input impedance at terminal 5 as viewed from source 3. The following identities in equations 14 and 15, each obvious to one skilled in the art, substituted into equation 6 result in equation 15.

$$i_{c1} = (h_{fe}+1) i_{b1} \qquad (13)$$

$$i_{c2} + (h_{fe}+1) i_{b2} \qquad (14)$$

$$i_{b1} = i_{b2} \qquad (15)$$

Equation 15 comes about because of transistors 1 and 2 having equal $h_{fe}$'s, it must be remembered. Substituting equation 15 into equation 2, equation 16 is obtained.

$$i_{b1} = \frac{-i_{IN}}{(G+1)} \qquad (16)$$

Now, in the case where current amplifier 7 is not used, $i_{b1} = -i_{IN}$. In either case, the variation of input signal potential at terminal 5 depends upon the variation of $i_{b1}$. So, in the case where current amplifier 7 is used, the reduction of sensitivity to $i_{IN}$ by a factor of $G+1$ insofar as input signal variation is concerned is indicative of a reduction of input impedance at terminal 5 by a factor of $(G+1)$ times.

This reduction in input impedance at terminal 5 can be forestalled, if desired, by coupling the base electrode of transistor 2 to the input of current amplifier 7 through a simple low-pass filter to by-pass signal currents to ground.

Current amplifier 7 may comprise a simple grounded emitter transistor of a conductivity type complementary to that of transistors 1 and 2. But, it is more often convenient to arrange current amplifier 7 to have minus unity current gain and to operate transistors 1 and 2 as a balanced emitter-coupled differential amplifier.

Figure 2:
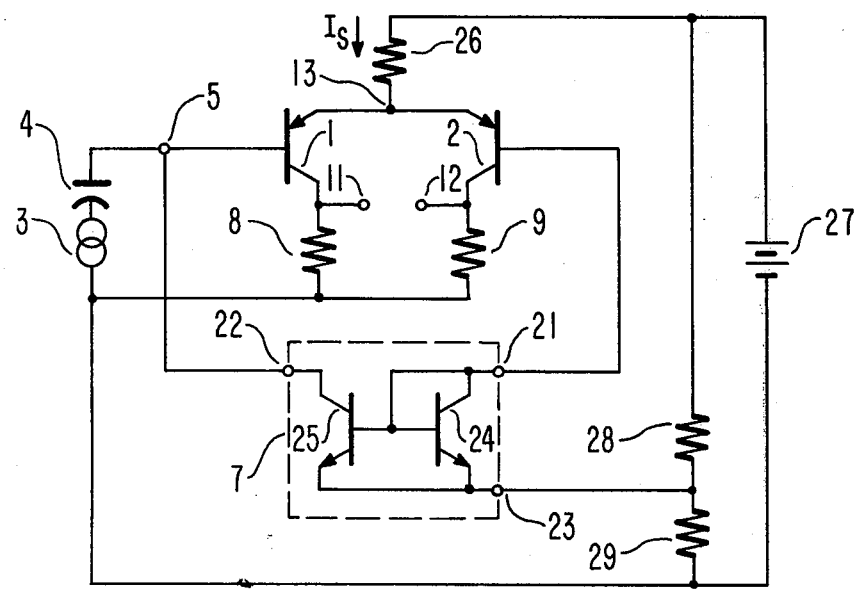
FIG. 2 is a schematic diagram of an amplifier having a PNP transistor in its input stage and embodying the present invention.

In FIG. 2, current amplifier 7 is of a type known as a "current mirror amplifier" with an input terminal 21, an output terminal 22, and a common terminal 23. It comprises a pair of transistors 24 and 25 connected to have equal base-emitter potentials, supplied by direct-coupled collector-to-base feedback of transistor 24. Neglecting the base currents of transistors 24 and 25, which currents are usually relatively small compared to their collector currents, this feedback conditions transistor 24 to accept as collector current the input current supplied to terminal 21. The collector current of transistor 25 is related to that of transistor 24 in the same ratio as their transconductances, since the transistors have equal base-emitter potentials. For transistors having base-emitter junctions with identical diffusion profiles, their transconductances are related in the same ratio as the areas of their base-emitter junctions. Since the areas can be very accurately scaled, the current gain of a current mirror amplifier is very well-defined and is substantially independent of the individual current gains of its component transistors. The input impedance of amplifier 7 is known to be the reciprocal of the transconductance of transistor 24, which transconductance is of the order of 33 millimhos per milliampere of applied current.

The current $I_S$ is caused to flow in accordance with Ohm's Law by impressing a substantially constant potential across resistor 26, which is done in the following way. The operating potential provided by battery 27 is applied to a potential divider comprising resistors 28 and 29. The divided potential is coupled (with some attendant potential offset) via the input circuit of amplifier 7 and the emitterfollower action of transistor 2 to interconnection 13. In a more complex circuit, the potential divided may comprise, in addition to resistors 28 and 29, elements to compensate for the temperature-dependent offset potentials across the input circuit of amplifier 7 and the base-emitter junction of transistor 2. Where the output signal is not too large, terminal 23 may be connected directly to ground; and the potential divider, dispensed with.

The FIG. 2 amplifier may be modified to improve its linearity. This can be done by including a resistor between interconnection 13 and the emitter electrode of one of transistors 1 and 2. Or resistors may appear between each of these emitter electrodes and interconnection 13 to form a tee-network; and, of course, an equivalent pi-network may be used instead of the tee-network.

The current mirror amplifier 7 may use field effect transistors rather than bipolar transistors. Any one of a number of known current mirror amplifiers may be used instead of amplifier 7, as shown.

Figure 3:
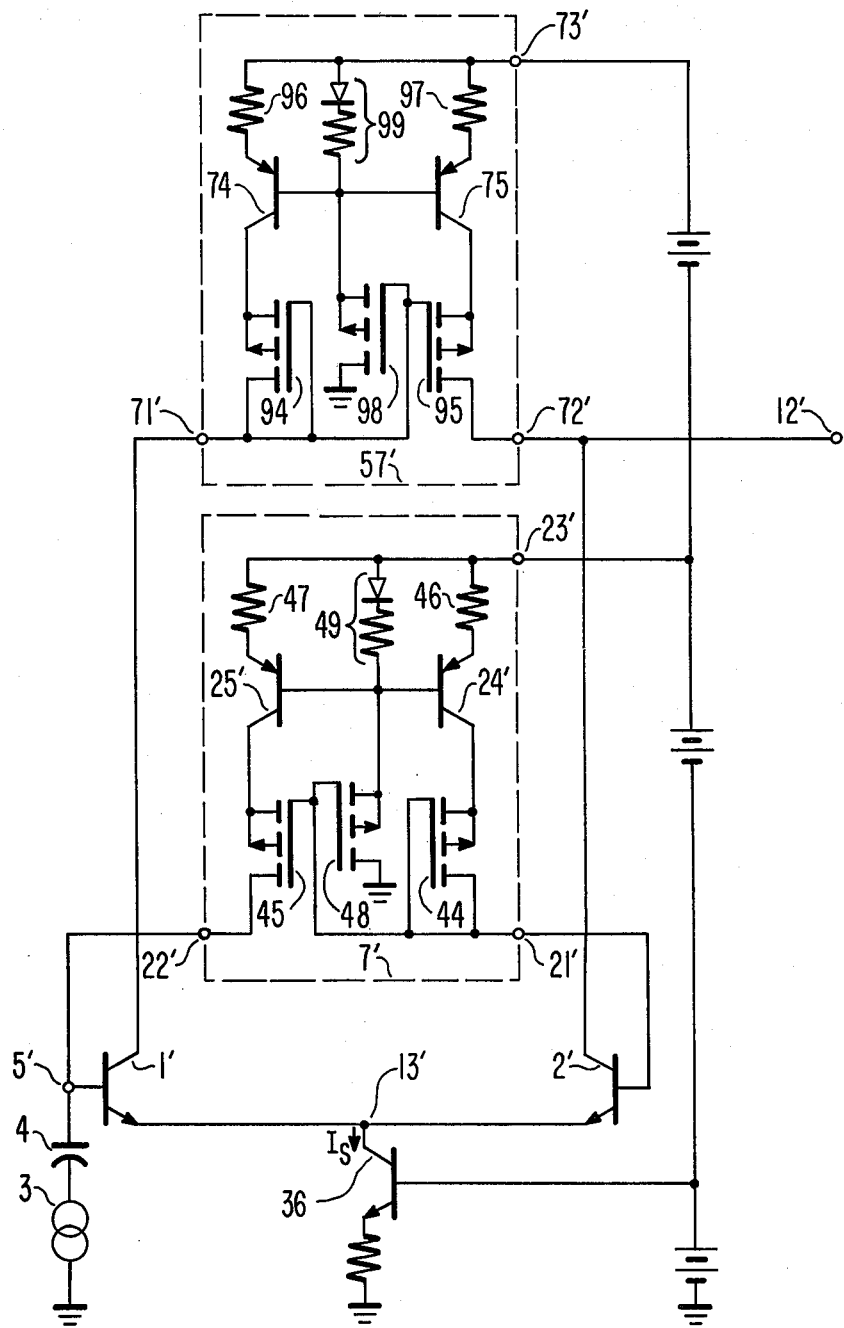
FIG. 3 is a schematic diagram of an amplifier having an NPN transistor in its input stage and embodying the present invention.

FIG. 3 shows a configuration in which input stage transistor 1' is an NPN transistor having its emitter electrode coupled to another NPN transistor 2'. $I_S$ is withdrawn from their emitter electrodes to supply the collector current demand of another NPN transistor 36 biased for constant current operation. A current mirror amplifier 7' responds to the base current of transistor 2' to supply a current to the base of transistor 1'.

The operation of current mirror amplifier 7' is generally analogous to that of amplifier 7. Transistor 25 is operated in cascode with common-gate field-effect transistor 45, however, to increase the open-loop output impedance exhibited by amplifier 7'. A self-biased field-effect transistor 44 is included in the collector connection of transistor 24' to make its collector potential equal to that of transistor 25' to improve the matching of the transconductance of transistors 24' and 25'. To the same end, resistors 46 and 47 provide emitter degeneration to transistors 24' and 25', respectively. The collector-to-base feedback connection of transistor 24' includes, in addition to self-biased transistor 44, a source-follower field-effect transistor 48 which forestalls the base currents of transistors 24' and 25' from affecting the current gain of amplifier 7'. Elements 49 provide a source load to source-follower transistor 48.

The balanced collector current variations of transistors 1' and 2' are converted to single-ended form to appear at output terminal 12' by a current mirror amplifier 57'. Amplifier 57' is structurally similar to amplifier 7'; the parts of amplifier 57' have identification numerals larger by 50 than their counterparts in amplifier 7'. Amplifiers 7' and 57' are assumed to have current gains of minus unity, since this gives most practical operation.

The FIG. 3 configuration may be modified to get better linearity by inserting a resistor between interconnection 13 and the emitter electrode of either of transistors 1' and 2'. Resistors may be inserted between interconnection 13 and both these emitter electrodes, also. Or a single resistor may link these emitter electrodes and transistor 36 may be replaced with a pair of transistors with their respective collector electrodes connected to the respective emitter electrodes of transistors 1' and 2'.

Transistors 1 and 2 or 1' and 2' may be compound transistors as well as single transistors; for example, they may each comprise a similar number of transistors in Darlington connection.

I claim:

1. In a transistor amplifier having:
first and second bipolar transistors of the same conductivity type, operating at substantially the same temperature and having similar current gains, each having base and emitter and collector electrodes;
an input signal terminal connected to said first transistor base electrode;
an output signal terminal;
first and second terminals for connection to a supply of operating power;
means coupling the emitter electrodes of said first and said second transistors to each other and providing a direct current conductive path from each of the emitter electrodes of said first and said second transistors to said first terminal;
first direct current conductive means connecting the collector electrode of said first transistor to said second terminal;
second direct current conductive means for coupling the collector electrode of said second transistor to said second terminal; and
load means included in at least one of said first and said second direct current conductive means, the improvement comprising:
a current amplifier having an input terminal connected to said second transistor base electrode, having an output terminal connected to said first transistor base electrode, exhibiting direct-coupled inverting current gain between its input and output terminals, and having a common terminal; and
means referring the potential at the common terminal of said current amplifier to at least one of the potentials appearing respectively at said first and said second terminals.

2. The improvement set forth in claim 1 wherein said current amplifier has substantially temperature-independent current gain.

3. The improvement set forth in claim 2 wherein said current amplifier is a current mirror amplifier.

4. In combination:
two transistors of the same conductivity type, each having base and emitter and collector electrodes, their respective emitter electrodes connected to one terminal for a current supply and individually coupled at their collector electrodes to the other terminal for said current supply, said transistors operating at substantially the same temperature and having substantially the same current gain;
a signal input terminal at the base electrode of said first transistor;
a signal output terminal at the collector electrode of one of said transistors; and
a feedback path comprising a current amplifier directly connected at its input terminal to the base electrode of said second transistor and at its output terminal to the base electrode of said first transistor, said amplifier exhibiting inverting current gain.

* * * * *